United States Patent [19]
Doan

[11] Patent Number: 6,057,581
[45] Date of Patent: May 2, 2000

[54] SELF-ALIGNED CONTACTS

[75] Inventor: Trung T. Doan, Boise, Id.

[73] Assignee: Micron Technology, Inc., Boise, Id.

[21] Appl. No.: 09/239,577

[22] Filed: Jan. 28, 1999

Related U.S. Application Data

[62] Division of application No. 08/916,060, Aug. 21, 1997, Pat. No. 6,010,935.

[51] Int. Cl.$^7$ ................................................. H01L 29/76
[52] U.S. Cl. ............................................ 257/401; 257/900
[58] Field of Search .................................. 257/401, 900; 438/970

[56] References Cited

U.S. PATENT DOCUMENTS

| | | | |
|---|---|---|---|
| 4,257,832 | 3/1981 | Schwabe et al. | 148/187 |
| 4,666,737 | 5/1987 | Gimpelson et al. | 427/89 |
| 4,682,403 | 7/1987 | Hartmann et al. | 29/571 |
| 4,764,248 | 8/1988 | Bhattacherjee et al. | 156/643 |
| 4,821,085 | 4/1989 | Haken et al. | 357/67 |
| 4,824,797 | 4/1989 | Goth | 437/67 |
| 4,839,301 | 6/1989 | Lee | 437/29 |
| 4,874,719 | 10/1989 | Kurosawa | 437/195 |
| 4,939,105 | 7/1990 | Langley | 437/228 |
| 4,948,756 | 8/1990 | Ueda | 437/195 |
| 4,994,402 | 2/1991 | Chiu | 437/41 |
| 4,996,081 | 2/1991 | Ellul et al. | 427/96 |
| 5,030,587 | 7/1991 | Wald et al. | 437/52 |
| 5,032,233 | 7/1991 | Yu et al. | 427/97 |
| 5,057,449 | 10/1991 | Lowrey et al. | 437/60 |
| 5,089,986 | 2/1992 | Sandhu et al. | 365/149 |
| 5,094,712 | 3/1992 | Becker et al. | 156/643 |
| 5,100,826 | 3/1992 | Dennison | 437/52 |
| 5,102,832 | 4/1992 | Tuttle | 437/231 |
| 5,139,967 | 8/1992 | Sandhu et al. | 437/173 |
| 5,159,428 | 10/1992 | Rao et al. | 357/49 |
| 5,160,408 | 11/1992 | Long | 156/656 |
| 5,169,491 | 12/1992 | Doan | 156/636 |
| 5,177,027 | 1/1993 | Lowrey et al. | 437/41 |
| 5,177,030 | 1/1993 | Lee et al. | 437/47 |
| 5,217,926 | 6/1993 | Langley | 437/228 |
| 5,229,331 | 7/1993 | Doan et al. | 437/228 |
| 5,278,098 | 1/1994 | Wei et al. | 437/192 |
| 5,286,344 | 2/1994 | Blalock et al. | 156/657 |
| 5,298,451 | 3/1994 | Rao | 437/192 |
| 5,298,463 | 3/1994 | Sandhu et al. | 437/192 |
| 5,300,463 | 4/1994 | Cathey et al. | 437/228 |
| 5,302,233 | 4/1994 | Kim et al. | 156/636 |

(List continued on next page.)

*Primary Examiner*—Mark V. Prenty
*Attorney, Agent, or Firm*—Knobbe, Martens, Olson & Bear, LLP

[57] ABSTRACT

A process of forming a self aligned contact on a surface of a wafer having one or more gate structures and a contact region adjacent the gate structures. The gate structures are isolated from the contact region by one or more spacers having predetermined thicknesses. The process comprises the steps of depositing a conformal etch stop layer over the gate structures and contact region, depositing a sacrificial layer over the etch stop layer, selectively removing a portion of the sacrificial layer to expose a portion of the etch stop layer adjacent the contact region and removing the etch stop layer to expose contact region. The etch stop layer protects spacers from damage resulting from selective etch of the sacrificial layer. In one preferred embodiment, the etch stop layer has a substantially uniform thickness and may be removed by a timed etch.

4 Claims, 4 Drawing Sheets

U.S. PATENT DOCUMENTS

| | | | |
|---|---|---|---|
| 5,306,951 | 4/1994 | Lee et al. | 257/755 |
| 5,309,023 | 5/1994 | Motonami et al. | 257/773 |
| 5,340,765 | 8/1994 | Dennison et al. | 438/398 |
| 5,344,525 | 9/1994 | Cathey, Jr. | 156/643 |
| 5,358,892 | 10/1994 | Rolfson | 437/70 |
| 5,366,590 | 11/1994 | Kadomura | 156/662 |
| 5,369,051 | 11/1994 | Rao et al. | 437/69 |
| 5,372,973 | 12/1994 | Doan et al. | 437/228 |
| 5,396,093 | 3/1995 | Lu | 257/306 |
| 5,403,435 | 4/1995 | Cathey et al. | 156/643 |
| 5,405,791 | 4/1995 | Ahmad et al. | 437/34 |
| 5,407,870 | 4/1995 | Okada et al. | 437/241 |
| 5,461,254 | 10/1995 | Tsai et al. | 257/646 |
| 5,472,896 | 12/1995 | Chen et al. | 437/44 |
| 5,480,814 | 1/1996 | Wuu et al. | 438/279 |
| 5,502,009 | 3/1996 | Lin | 437/239 |
| 5,505,816 | 4/1996 | Barnes et al. | 156/662.1 |
| 5,595,928 | 1/1997 | Lu et al. | 437/52 |
| 5,700,349 | 12/1997 | Tsukamoto et al. | 437/228 |
| 5,700,708 | 12/1997 | Chen et al. | 438/253 |
| 5,710,067 | 1/1998 | Foote et al. | 437/238 |
| 6,010,935 | 1/2000 | Doan | 438/303 |

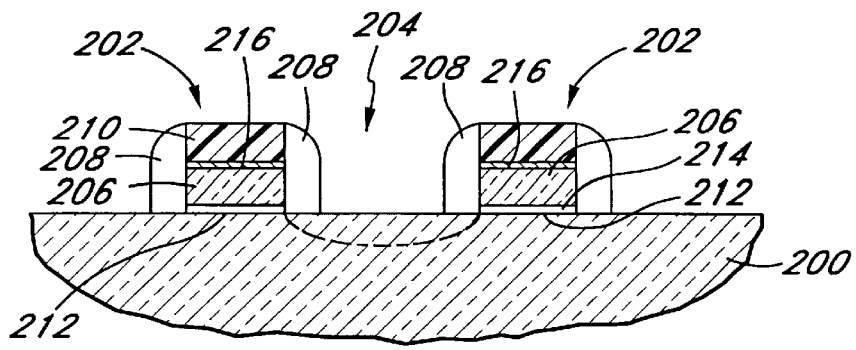
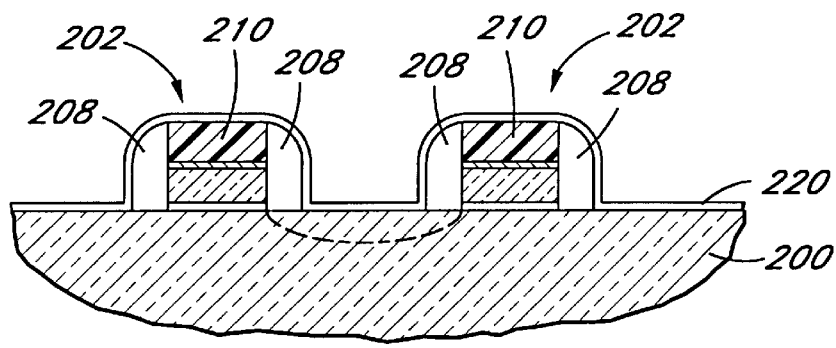
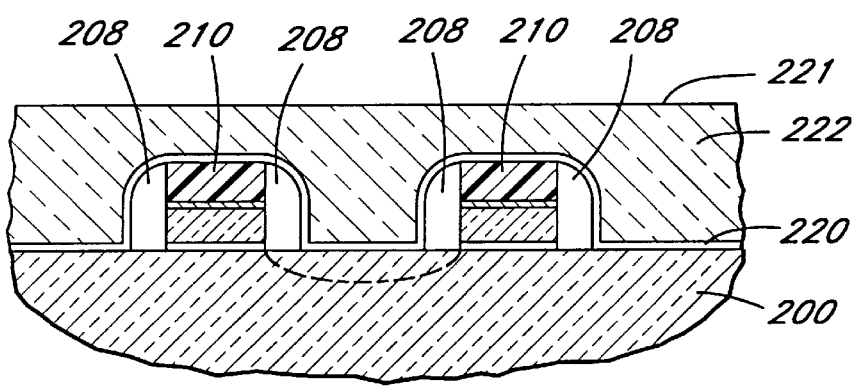
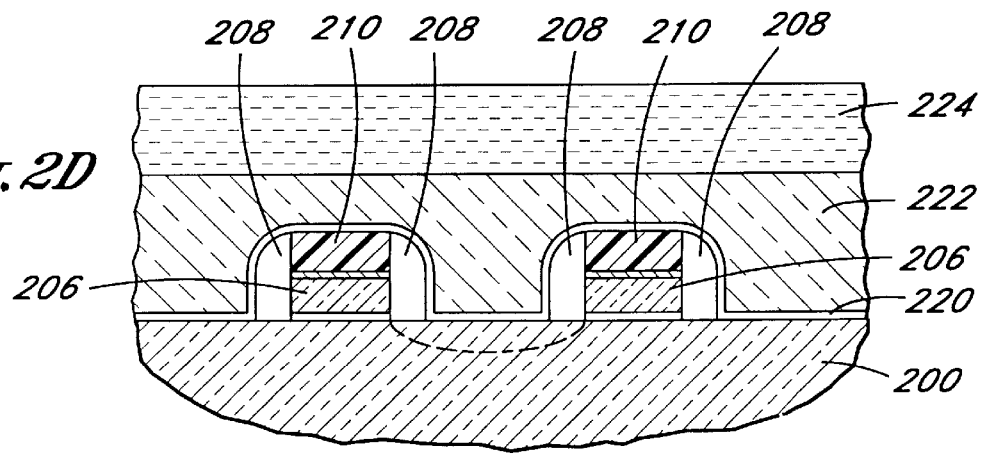

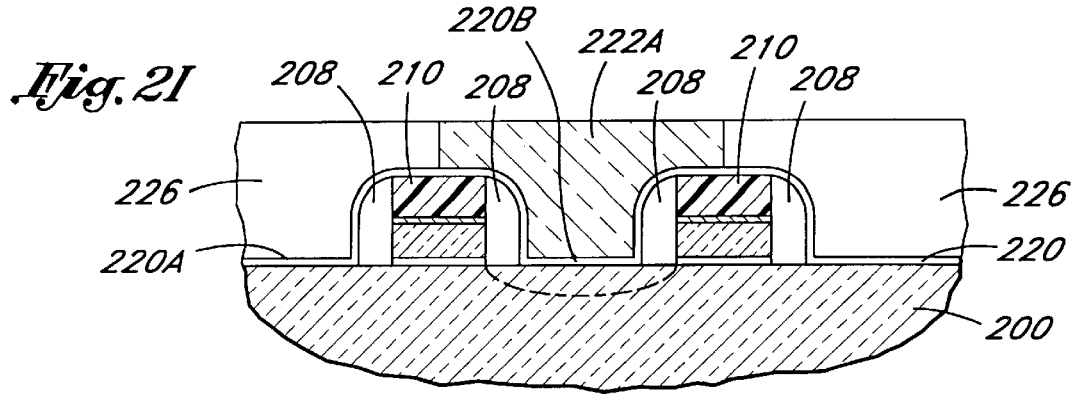
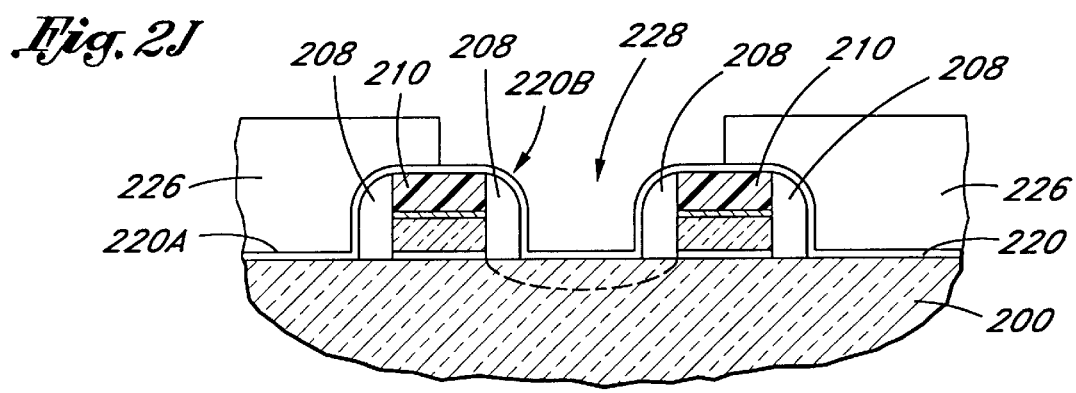
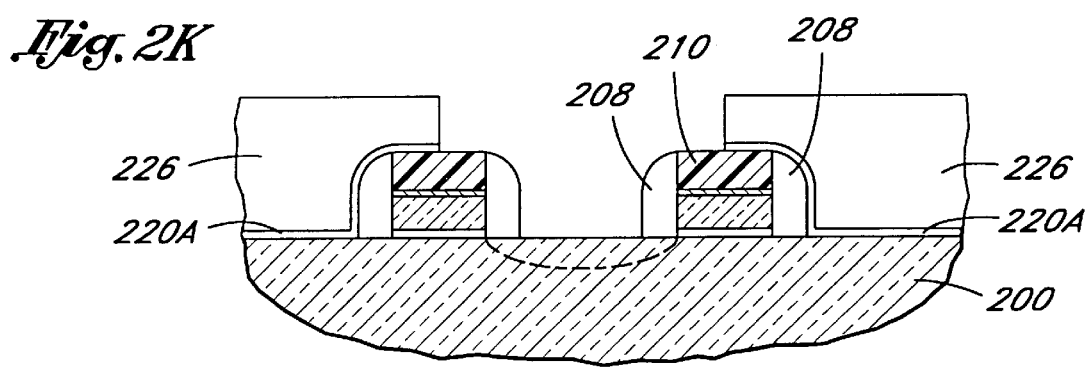
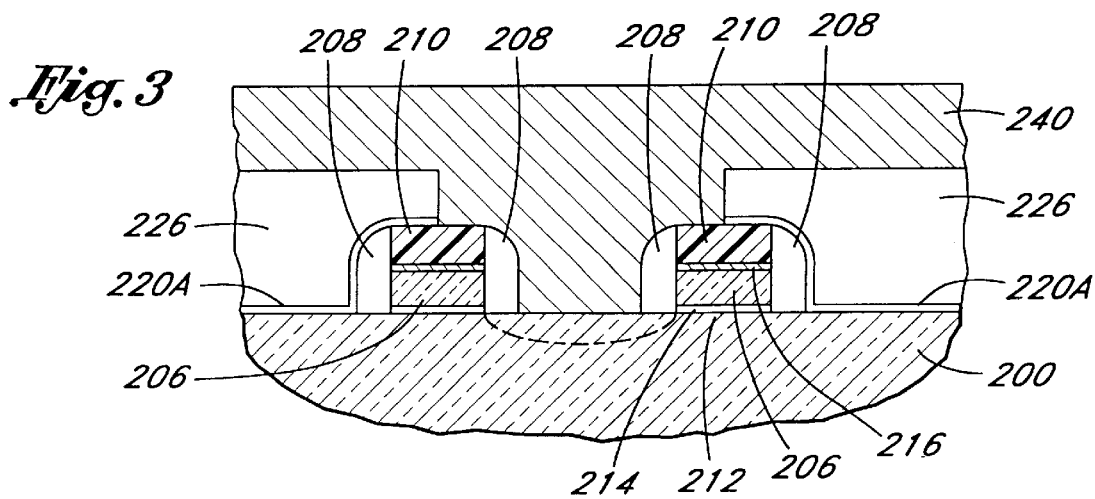

SELF-ALIGNED CONTACTS

REFERENCE TO RELATED APPLICATION

The present application is a divisional of U.S. application Ser. No. 08/916,060, filed Aug. 21, 1997 now U.S. Pat. No. 6,010,935.

BACKGROUND OF THE INVENTION

1. Field of the Invention

The present invention generally relates to semiconductor integrated device design and fabrication and, more particularly, to techniques for improving self aligned contact (SAC) fabrication in ULSI memory arrays such as dynamic random access memories (DRAM).

2. Description of the Related Art

An insulated gate field-effect transistor (FET) is made from a silicon wafer using state-of-the-art semiconductor processing techniques. Typically these FET's are comprised of a conductively doped polycrystalline silicon gate electrode, a thin gate dielectric lying under the gate electrode, and a pair of source/drain regions formed in the silicon wafer body.

The source and drain regions are separated from each other by a channel region that lies below the gate dielectric (oxide). The source/drain regions are typically created using an ion implantation doping technique in which the gate electrode itself is conveniently used as an implantation mask to prevent unwanted doping of the channel region. In this respect, in order to avoid an electrical short between the source and the drain regions, the channel region should be free of dopant atoms. Additionally, having insulating sidewall-spacers along the sidewalls of the gate electrode may also provide a better implantation shield for the channel region. These spacers increase the initial lateral separation between the source/drain regions which in turn prevents an undesirable overlap between the gate electrode and the source/drain regions.

Once the source/drain regions have been implanted and the gate electrode structure has been formed, the source and drain must then be electrically connected to the circuit. Typically, a source/drain contact metallization process, i.e., deposition of conductive contacts, must be done to form the contacts for these source/drain regions. However, this is not an easy task in the semiconductor industry. A contact metallization process requires that a patterned masking layer or layers be used to expose the contact openings of the underlying device structures while protecting surrounding devices from the unwanted effects of etching and depositing materials. Typically, self aligned contact processes are used to expose the contact openings. These processes use the selective etchability of the different layers to allow for less precise alignment of the masks to thereby expose the contact regions. In the past, using conventional lithographic techniques, mask alignment tolerances and the contact metallization process itself have significantly limited both the degree of simplification and the degree of chip size reduction that could be attained. Self-aligned contact opening technologies in general help to alleviate limitations set by mask alignment tolerances.

Self-aligned contact (SAC) fabrication technology uses a selective etching process to etch a contact opening through a masking layer or layers along the upper surfaces of the source/drain regions. It is understood that commonly used materials, such as silicon nitride, silicon oxide, silicon, polysilicon and photoresist all have different etch removal rates when exposed to various etchants. The boundaries of the contact openings are determined by the etch rate difference between the spacer material (e.g., silicon nitride), and the masking material (e.g., silicon oxide). Specifically, the spacer has a slower etch rate than the oxide so that the contact opening can be defined by using an etchant that will quickly remove the masking material but not have such a great effect on the spacer. Hence, the photoresist pattern that is used to define the contact opening need not be precisely aligned with the active area. In other words, the opening defined by the resist mask may be wider than the active area to which contact must be made. Consequently, this makes the SAC technique very attractive for ULSI applications where small device dimensions require very tight masking tolerances.

An exemplary prior-art SAC fabrication process can be seen in FIGS. 1A through 1D. In FIG. 1A, an exemplary pair of gate stack structures 102 is located on the surface of a silicon substrate 100 and define a source/drain region 104. Further, as seen in FIG. 1A, both of the gate stack structures have a polysilicon core (layer) 106 surrounded by a pair of nitride sidewall spacers 108 and a nitride top spacer 110. As a first step in the SAC opening process, the circuitry shown in FIG. 1A is covered with a silicon oxide layer 111 (FIG. 1B) and a photoresist layer 112 (FIG. 1C). The photoresist layer 112 is then patterned to thereby expose the oxide layer 111 and to define contact holes 116 (FIG. 1D). Through openings 114 in the photoresist layer, the underlying silicon oxide 111 is selectively etched to form a contact hole 116 in the silicon oxide 111 (FIG. 1D). Etchants used in this process must be selective to nitride, silicon and photoresist. That is, etchants selectively leave nitride spacers while etching away silicon oxide.

However, conventional SAC technology presents some problems due to its strict dependence on the selectable etchability of the materials. As seen in the prior art example given above, due to the use of silicon oxide masking layers, nitride becomes an irreplaceable material for spacer structures. However, silicon oxide, for example, possesses many advantageous features over nitride material as a spacer material. Some of these advantages are simplified processing and soft dielectric characteristics of the silicon. Additionally, oxide spacers induce less stress over the substrate and the neighboring gate stack layers, as compared to nitride spacers. As is well known in the art, nitride is a rigid and brittle material. When deposited on materials having less rigidity, the nitride increases the stress level in the neighboring materials and hence causes stress induced defects.

Another problem with the conventional SAC is the requirement of using an etching process very selective to nitride. In deep sub-half micron ULSI conditions, however, this is almost impossible. Even with costly equipment and highly selective processes, there is always some amount of etching in the nitride spacers 108, 110. Since the depth of the oxide layer 111 is much greater over the substrate than over the spacers 108, 110, the spacers are exposed to the etchants for a long time before the substrate 200 is exposed. Accordingly, even highly selective etchants will consume some of the spacers 108, 110. As discussed above, the spacers 108, 110 not only protect the polysilicon gate from the etchants, they also provide electrical isolation between the gate and the contact region. Therefore, for very small device dimensions, even a small amount of etching of the spacers can increase the likelihood of an electrical short between the gate electrode and the conductive contact material.

SUMMARY OF THE INVENTION

There is an increasing need in the industry for an improved self aligned contact fabrication process for ULSI applications. In particular, there is a need for an improved self aligned contact fabrication process that reduces the need for using silicon nitride as a spacer and maintains the thickness of the spacer material throughout the etching process to thereby maintain a desired degree of electrical isolation between the polysilicon gate and the contact region.

In accordance with one aspect of the present invention, a process is provided for fabricating a self-aligned contact to a semiconductor substrate. The process includes providing at least one gate structure on a substrate surface and a contact region adjacent the gate. The gate includes at least one spacer, which serves to isolate the gate structure from the contact region. The process further comprises depositing an etch stop layer over the gate structure and the contact region, followed by deposition of a sacrificial layer over the etch stop layer. A portion of the sacrificial layer is then selectively removed from over the etch stop layer over the contact region. The etch stop layer protects the spacer and contact region during this etch.

In accordance with another aspect of the present invention, a process is provided for fabricating a self-aligned contact and integrated circuit. The process includes forming at least one gate structure on a substrate surface and a contact region adjacent the gate. The gate structure includes at least one insulating spacer thereover. An etch stop layer and a sacrificial layer are deposited sequentially over the gate structure and the contact region. A plug is formed from the sacrificial layer by removing portions of the sacrificial layer outside of the contact region. The plug itself is then selectively removed from over the etch stop layer, while the etch stop layer protects the spacer and the contact region from damage.

In accordance with still another aspect of the present invention, a process is disclosed for fabricating a self-aligned contact in a semiconductor substrate. The process comprises providing a gate structure defining a contact region adjacent the gate structure on the substrate. The gate structure includes a plurality of insulating spacers. An etch stop layer with a substantially uniform thickness is deposited over the spacers and contact region. A sacrificial layer is then deposited over the etch stop layer and portions of the sacrificial layer are selectively removed. Selective removal leaves a sacrificial plug over the contact region. An insulating layer is then deposited over the plug and the exposed regions of the etch stop layer and the plug is then exposed. The plug is then selectively removed from within the insulating layer, thereby exposing an inside portion of the etch stop layer. This inside portion of the etch stop layer is then removed.

In accordance with still another aspect of the present invention, a process is disclosed for forming a contact through an insulating layer. The process comprises removing an etch stop layer from directly over the semiconductor substrate and a gate side wall spacer. In accordance with this aspect of the present invention, the spacer comprises the same material as the insulating layer.

In accordance with still another aspect of the present invention, a process for forming a self-aligned contact is provided. The process comprises forming an etch stop layer of a substantially uniform thickness over a substrate and gate spacers. A sacrificial plug surrounded by an insulating layer is then formed. The sacrificial plug is then removed from within the insulating layer and from over the etch stop layer. The etch stop layer is then removed.

In accordance with yet another aspect of the present invention, an integrated circuit is disclosed, comprising a semiconductor substrate with an active area. The gate structure is provided over the substrate adjacent the active area. The gate structure, in turn, includes an insulating spacer on its surface. An insulating layer overlies the substrate and the gate structure, comprising the same material as the spacer. A conductive contact extends adjacent the gate structure to the active area, making direct contact with both the spacer and the active area.

These and other aspects and advantages of the present invention will become more fully apparent from the following description, taken in conjunction with the accompanying drawings.

BRIEF DESCRIPTION OF THE DRAWINGS

FIG. 2A is a schematic section of a silicon wafer that has been developed up to the point prior to formation of a self aligned contact (SAC) for a DRAM array;

FIG. 2B illustrates the wafer of FIG. 2A, wherein a layer of silicon oxide has been over previously fabricated gate stacks;

FIG. 2C illustrates the wafer of FIG. 2B, wherein a layer of polysilicon has been deposited on top of the silicon oxide layer;

FIG. 2D illustrates the wafer of FIG. 2C, wherein a photoresist has been deposited on top of the polysilicon layer;

FIG. 2I illustrates the wafer of FIG. 2H, wherein the silicon oxide layer has been planarized by a Chemical Mechanical Planarization (CMP) process to expose the polysilicon plug in the silicon oxide layer;

FIG. 2J illustrates the wafer of FIG. 2I, wherein the polysilicon plug has been etched away from the self aligned contact region; and FIG. 2K illustrates the wafer, of FIG. 2J, wherein the first silicon oxide layer is stripped from the self aligned contact region.

FIG. 3 illustrates the wafer of FIG. 2K, wherein conductive material is deposited into the self aligned contact region.

DETAILED DESCRIPTION OF THE PREFERRED EMBODIMENT

Figure 1A:
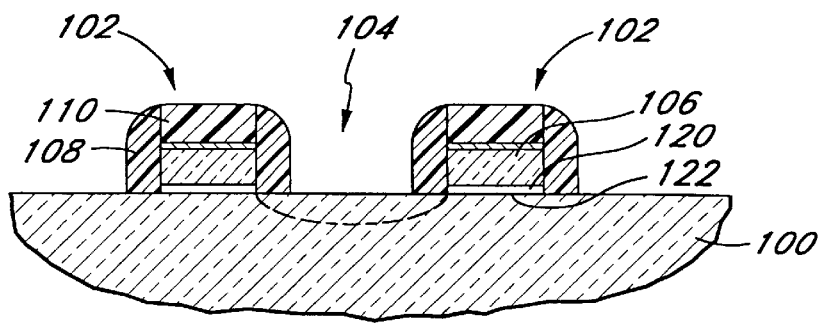
FIG. 1A is a schematic section of a silicon wafer that has been developed up to the point prior to formation of a prior art self aligned contact (SAC) for a DRAM array.
Figure 1B:
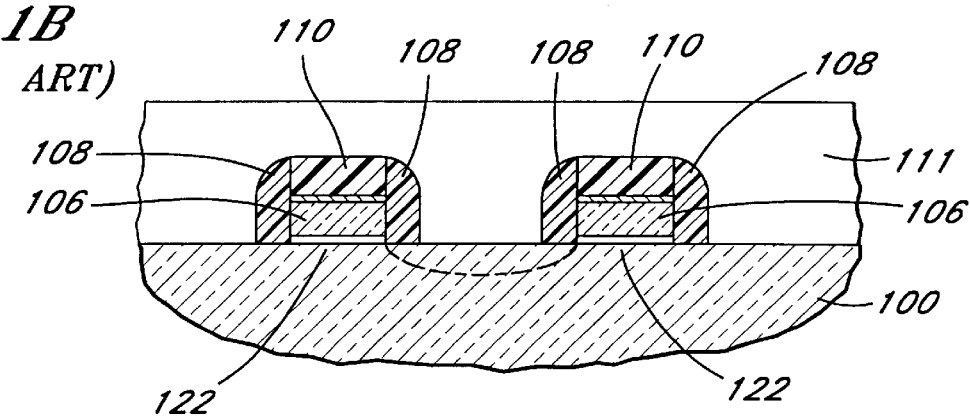
FIG. 1B is a schematic view, of the prior art wafer shown in FIG. 1A wherein a layer of silicon oxide has been deposited over fabricated gate stacks.

Reference will now be made to the drawings wherein like numerals refer to like parts throughout. FIG. 2A illustrates a partially fabricated silicon wafer 201 having a substrate 200, having a plurality of gate stack structures 202 and doped source/drain regions 204 formed thereon. As shown in FIG. 2A, the gate stack structure 202 may, for example, comprise a layer of polysilicon (poly) 206 and a pair of sidewall spacers 208 formed vertically along the side walls of the gate stack structure 202. A horizontal spacer 210 also protects the underlying gate layers. Each gate 202 overlies a channel region 212 of the substrate 200. A gate dielectric or first silicon oxide layer 214 is interposed between the substrate 200 and the conductive layers of the gate structure 202. As illustrated, those layers may include a refractory metal layer 216 overlying the polysilicon layer 206 to bolster conductivity of the gate.

As will be understood by one of skill in the art, the polysilicon gate 206 forms the gate of a transistor or some other electrical component. The spacers 208 and 210 in the prior art have been formed from silicon nitride (nitride) and are used to protect the gate electrode 206 from the etchants used to expose the contact region 204 and also act as a shield during the various implantation steps to prevent dopant atoms from entering the channel region 212 of the substrate 200 positioned under the gate structure 202. The spacers 210 and 208 are also used to provide electrical isolation between the gate electrode 206 and the contact region 204. Each of the components of the gate structure 202 are formed using well known techniques and using well known materials.

As discussed in the "Background" section above, despite its many disadvantages as a spacer material, the conventional self aligned contact processes almost invariably use nitride as a spacer material due to required etching selectivity for the process. However, as will be understood from the following discussion, the SAC process presented in this embodiment does not necessarily require nitride as a spacer material. In fact, in the preferred embodiment, silicon dioxide is used as the material for the spacers 208, 210. The silicon dioxide side wall spacer 208 is preferably formed by a CVD TEOS (tetraethoxysilane) oxide deposition, which involves decomposing TEOS at a temperature near 700° C. As mentioned above, silicon oxide has many advantages over nitride spacers, such as less stress induction and processing advantages (lower temperature deposition, better coverage, etc.). It will be understood, however, that the present invention allows use of a wide variety of spacer materials.

As illustrated in FIG. 2B, a conformal layer of a suitable passivation material is deposited on the wafer 201, thus forming an etch stop layer 220. The preferred etch stop layer 220 is comprised of a continuous thin film with a substantially uniform thickness covering the exposed surfaces of the wafer 201. In this embodiment, the etch stop layer 220 is comprised of a layer of silicon dioxide. Preferably, the layer 220 is between about 25 Å and 5,000 Å, more preferably between about 50 Å and 2,000 Å, and most preferably about 100–200 Å. In contrast to the prior art SAC processes, the present invention employs this etch stop layer 220 to protect the gate stacks 202 and source drain regions 204 from the unwanted over-etch during the SAC opening process.

Figure 1C:
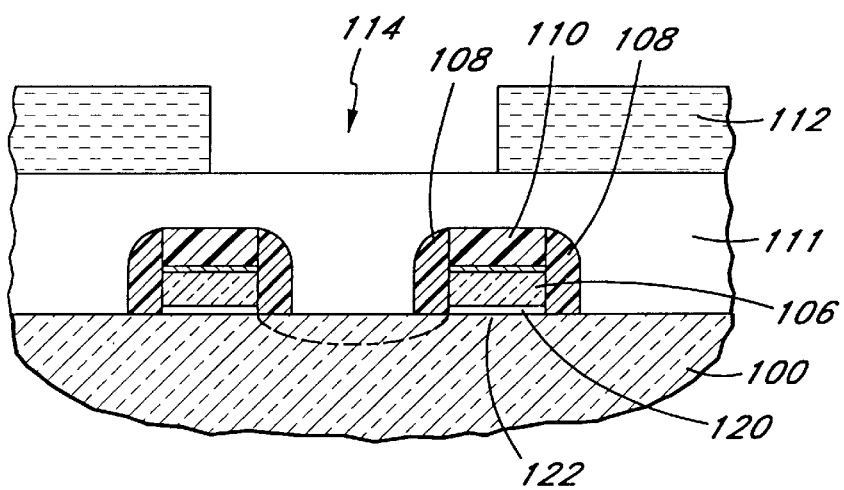
FIG. 1C is a schematic view of the prior art wafer shown in FIG. 1B wherein a photoresist has been deposited and patterned on top of the silicon oxide layer.
Figure 1D:
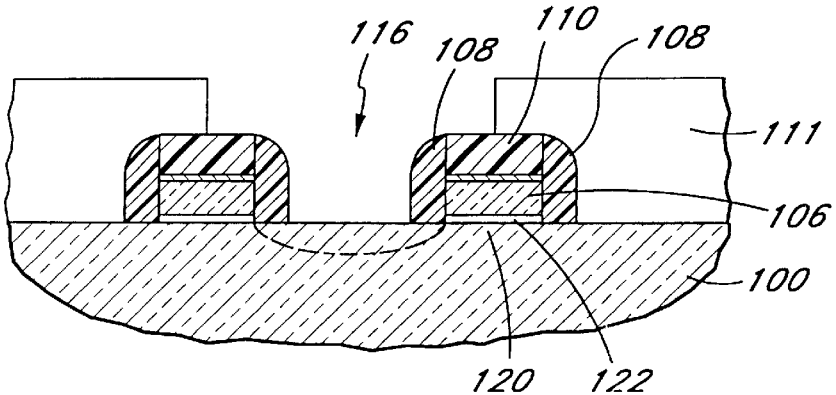
FIG. 1D is a schematic view of the prior art wafer shown in FIG. 1C wherein a selective etching is applied to the exposed portions of the silicon oxide to expose contact regions on the wafer substrate.

Ultimately, this etch stop layer 220 will be the last layer removed in opening the contact to the substrate. "Substantially" uniform should be understood in contrast to prior art layers 111 (FIG. 1C), which is the last layer removed in opening a contact by prior art techniques. In that case, much more material is removed from over the substrate 100 than from over the gate spacers 108, 110. During etch, the spacers 108, 110 are thus exposed to the etchants for a long period of time.

In contrast, the thickness of the etch stop 220 of the preferred embodiment is substantially uniform over the spacers 208, 210 and the substrate 200. The thickness over the spacers 208, 210 is at least about 50% of the thickness over the substrate 200, preferably at least about 70%, and more preferably between about 90% and 110%. Most preferably, the etch stop 220 uniformity in thickness is sufficient to allow a timed etch without damaging underlying structures.

FIG. 2C illustrates that, once the etch stop layer 220 is formed over the gate stacks 202 and the source/drain regions 204, a sacrificial layer 222 is deposited on top of the wafer 201. The sacrificial layer 222 is preferably deposited to a selected thickness sufficient to fill all the gaps between the adjacent gate stack structures 202. Most preferably, the layer 222 is planarized to provide a planar upper surface 221 on the wafer 201. The sacrificial layer 222 preferably comprises a polysilicon layer and can be deposited using any of a number of well known techniques in the art.

In this embodiment, a CVD technique can be used to deposit the poly sacrificial layer 222. In particular, CVD poly is preferably deposited by pyrolyzing silane ($SiH_4$) at about 600° C. Because the sacrificial layer need not form part of the final structure, conductivity of the sacrificial layer 222 is unimportant. Undoped poly may thus be utilized for the sacrificial layer 222. As will be understood in the following processing steps, the sacrificial layer 222 is preferably selectively etchable relative to the thin etch stop layer 220. The sacrificial layer 222 will be defined and etched to form the self aligned contact opening in this layer. This etch can be achieved using a selective etch process. Selective etching refers to the ability of the etchants to etch different materials with different etch rates. When exposed to same etchant, the etching rate of one material may be many times higher than that of another material. In this respect, the sacrificial layer 222 should have a substantially different characteristic etch rate as compared to that of the etch stop layer 220, such that etching through the poly layer 222 should not etch through the etch stop layer 220. In the preferred embodiment, the etch rate of the sacrificial layer 220 is at least 5 times, preferably at least 10 times, and most preferably at least 20 times higher than the etch rate of the etch stop layer 220.

Figure 2E:
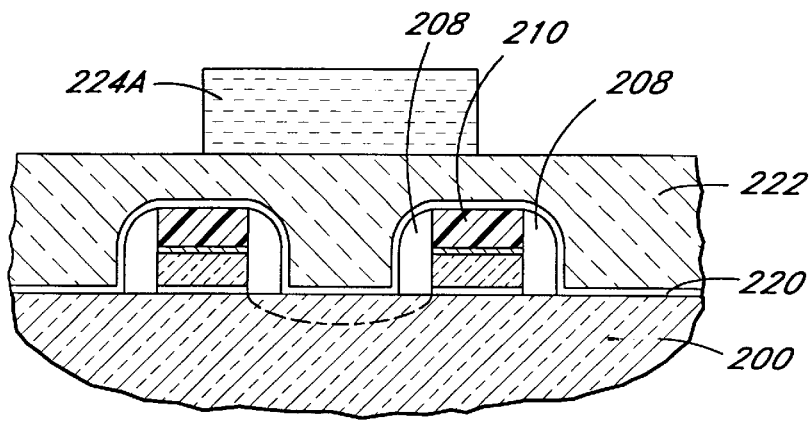
FIG. 2E illustrates the wafer of FIG. 2D, wherein the photoresist has been etched to mask a self aligned contact region on the polysilicon.

As illustrated in FIG. 2D, a layer of masking material 224, such as photoresist, is then deposited on the planar surface 221 on top of the poly sacrificial layer 222. This photoresist layer 224 is preferably comprised of a negative photoresist and can be deposited and patterned using any known technique in the art. As illustrated in FIG. 2E, after patterning the photoresist layer 224 on the poly layer 222, a wet or dry photoresist etch is selectively performed to leave a portion 224A of the photoresist layer 224 on top of the poly layer 222 in a standard photolithographic process.

Figure 2F:
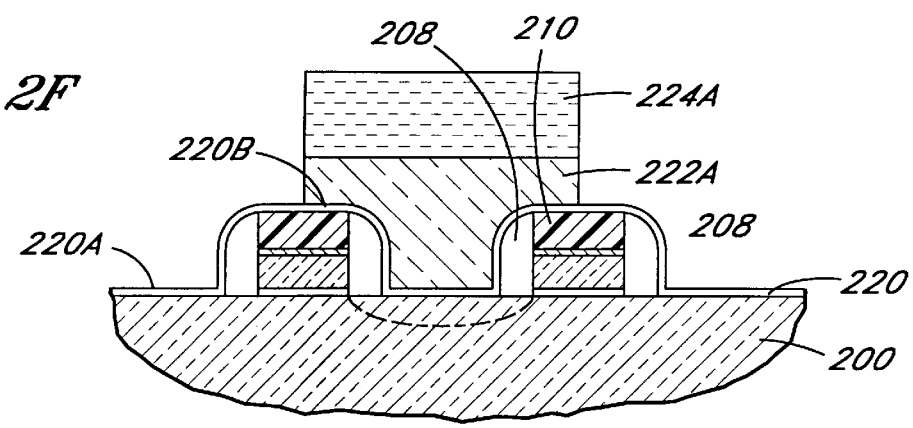
FIG. 2F illustrates the wafer of FIG. 2E, wherein the exposed portions of the polysilicon layer has been etched to form a polysilicon plug over the self aligned contact region.

As illustrated in FIG. 2F, after masking the poly layer 222 with the photoresist portion 224A, a dry or wet etch is conducted to etch the poly layer 222 selectively relative to the photoresist mask 224A and the etch stop layer 220, thereby leaving the polysilicon plug 222A intact within the future SAC region. As previously mentioned, this polysilicon plug 222A has the size and shape of the future contact opening. Preferably, an anisotropic etch (e.g., HBr and $Cl_2$ plasma etch) is carried out to etch the exposed portions of the poly layer 222 selectively until outside portions 220A of the thin etch stop layer 220 are exposed. In other words, the etching of the unmasked portions of the poly layer 222 effectively stops at the thin etch stop layer 220 and regions under the outside portions 220A of the etch stop layer 220 are protected from being etched away. An inside portion 220B of the etch stop layer 220 remains below the poly plug 222A. The exposed outside portions 220A of the etch stop layer 220 may optionally be removed at this stage.

Figure 2G:
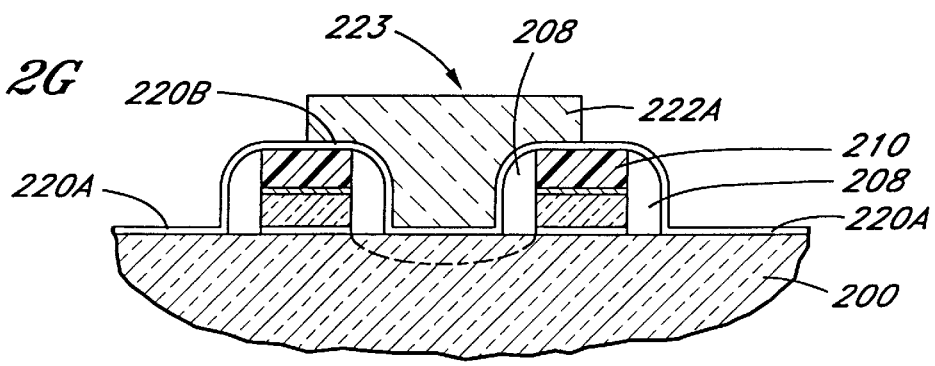
FIG. 2G illustrates the wafer of FIG. 2F, wherein the photoresist mask has been stripped from the top of the polysilicon plug.
Figure 2H:
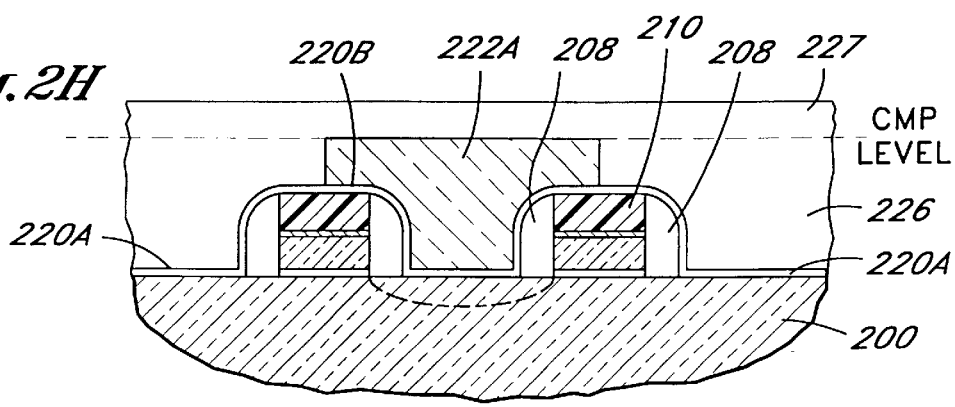
FIG. 2H illustrates the wafer of FIG. 2G, wherein a silicon oxide layer has been deposited on top of the wafer.

As shown in FIGS. 2G–2H, following the removal of remaining photoresist 224A, an insulating layer 226 is deposited on top of the wafer 201 to a selected thickness sufficient to cover the upper surface 223 of the sacrificial plug 222A and fill the gap between adjacent plugs (not shown). In the preferred embodiment, the insulating layer 226 is preferably comprised of a silicon oxide layer, such as BPSG, which can be deposited using any number of techniques known in the art. The illustrated insulating layer 226 is selectively etchable relative to the sacrificial layer material forming the plug 222A so as to prevent any over etch during the subsequent etch steps. It will be appreciated from the following discussion that the preferred insulating layer 226 does not need to be defined using a photoresist layer. When the poly plug 222A is etched, the etching selectivity between the second masking layer 226 and the plug 222A determines the desired contact pattern.

Since the preferred spacers 208, 210 comprise silicon oxide, the preferred insulating material 226 comprises the same material as the spacers 208, 210. Of course, it will be understood that the oxides of the spacers and the insulating layer have different densities, dopants and material characteristics. However, the basic silicon oxide composition makes the spacers and the insulating layer susceptible to similar etchants.

As illustrated in FIG. 2I, after the deposition of the insulating layer 226, the upper surface of the insulating layer 226 is planarized, i.e., eroded away, by using a planarization technique. The planarization process produces a plane surface by mechanical abrasion, which is often referred to as mechanical planarization. In the mechanical planarization, the actual material removal is done by fine abrasive particles which are partly embedded in a surface of a pad. During the mechanical planarization, in general, wafers to be planarized are mounted on a fixture and pressed against the pad under pressure while being rotated relative to the pad.

However, planarization can also be done by a combined effect of chemical reaction and mechanical abrasion. This type of planarization process is known as chemical mechanical planarization (CMP). While mechanically abrading the layer, a controlled amount of abrasive slurry, which is fed onto the pad, aids removal of the material. A CMP slurry is generally a colloidal suspension of fine abrasive particles such as silica particles and an aqueous solution of chemical etchants such as potassium hydroxide (KOH) or ammonium hydroxide ($NH_4OH$). A top portion 227 (FIG. 2H) of the insulating layer 226 is thus removed to expose an inside top surface of the poly plug 222A for the subsequent etch process.

As illustrated in FIGS. 2J, the poly plug 222A is selectively etched from a contact opening 228 to expose an inside portion 220B of the etch stop layer 220 which still covers the surface of the source/drain region 204 and the outer surface of the gate stacks 202 in the contact opening 228. During the poly plug 222A etching, the etch stop layer effectively seals the underlying top and sidewall spacers 210, 208 and does not allow any loss from spacer materials. The poly plug 222A can be etched using any known selective etching processes, such as gas plasma etches. This etch may be identical to that which formed the sacrificial plug 222A originally.

As illustrated in FIG. 2K, following the poly plug removal step, the exposed inside portion 220B of the etch stop layer 220 is stripped from the contact opening 228. The exposed etch stop layer can be removed by employing any of a number of etching techniques, including wet or dry etching. For example, a dry etch (e.g., HBr and $Cl_2$ plasma etch) may be timed to remove the inner portion 220B of the etch stop 220 without eating into underlying structures. Alternatively, optical end-point techniques may be utilized to stop the etch when the substrate is exposed. Preferably, the oxide etch utilizes a fluorine chemistry, such as dry etch processes using $CF_4$ or $CHF_3$ and $O_2$.

As opposed to the prior art, however, use of this etch stop layer 220 advantageously eliminates the major prior art problems such as spacer material loss, and the use of nitride as spacer material. In the present invention, the etch stop layer 220 is thin and has uniform thickness so that etching progresses uniformly and is completed without any material loss especially from the underlying spacers 208, 210. Further, since the etch stop layer 220 is substantially uniform, the material of the spacers 208, 210 need not be such as to afford selective etch of the poly plug 222A. The etch may be timed or optically monitored to stop before causing any material loss from the spacers 208, 210. Of course, depending upon the selected materials, removal of the etch stop can also be selective. The substantial uniformity of the etch stop layer 220, however, does away with the necessity for selective etch over the spacers by eliminating the step differential between thickness of material removed from over the gate and the thickness of material removed from over the substrate.

Following the removal of the inner portion 220B of the etch stop layer 220, contact metallization and the rest of the manufacturing flow proceeds by the normal process steps. FIG. 3 illustrates the contact formed as the result of depositing conductive material 240 over the structure of FIG. 2K. In accordance with the preferred embodiment, both the spacers 208 and/or 210 and the insulating layer 226 may comprise the same material, such as the preferred oxide.

It will be understood that the improved self aligned contact (SAC) process provided by the present invention minimizes the aforementioned prior art SAC process problems due to the use of a conformal etch stop layer. In contrast to the conventional SAC processes, the capability of performing sequential selective etchings over an etch stop layer minimizes the etch damage occurring on the spacers bordering the contact region. Further, the use of the etch stop layer substantially improves the conventional SAC process and allows the use of wide variety of materials as spacer material.

Hence, although the foregoing description of the preferred embodiment of the present invention has shown, described and pointed out the fundamental novel features of the invention, it will be understood that various omissions, substitutions, and changes in the form of the detail of the apparatus and method as illustrated as well as the uses thereof, may be made by those skilled in the art, without departing from the spirit of the present invention. Consequently, the scope of the present invention should not be limited to the foregoing discussions, but should be defined by the appended claims.

What is claimed is:

1. An integrated circuit, comprising:
   a semiconductor substrate, including an active area;
   a gate structure over the substrate adjacent the active area;
   an insulating spacer on a surface of the gate structure;
   a planarized insulating structure over the substrate and directly over at least part of the spacer, wherein the insulating structure and the spacer both comprise a type of silicon oxide, wherein the planarized insulating structure includes a conformal silicon dioxide etch stop layer; and
   a conductive contact adjacent the gate structure, in direct contact with the spacer and the active area.

2. The integrated circuit of claim 1, wherein the insulating structure further comprises a borophosphosilicate glass layer overlying the conformal silicon dioxide etch stop layer.

3. An integrated circuit, comprising:
   a semiconductor substrate, including an active area;
   a pair of gate structures over the substrate on either side of the active area;
   oxide spacers on surfaces of each gate structure;
   a planarized oxide material over the substrate and directly over at least part of each of the oxide spacers, the planarized oxide material comprising a layer of borophosphosilicate glass and a layer of silicon dioxide between the layer of borophosphosilicate glass and the spacers; and
   a self-aligned conductive contact between the gate structures, in direct contact with the spacers and the active area.

4. The integrated circuit of claim 3, wherein the layer of silicon dioxide is conformal over the at least part of each of the oxide spacers.

* * * * *